(12) United States Patent
Parker et al.

(10) Patent No.: US 6,243,843 B1
(45) Date of Patent: Jun. 5, 2001

(54) POST-MISSION TEST METHOD FOR CHECKING THE INTEGRITY OF A BOUNDARY SCAN TEST

(75) Inventors: Kenneth P. Parker, Fort Collins; Stig Oresjo, Loveland, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/370,076

(22) Filed: Jan. 9, 1995

(51) Int. Cl.$^7$ .............................. G01R 31/28; G06F 11/00
(52) U.S. Cl. ............................................. 714/726; 714/735
(58) Field of Search .................................. 371/22.3, 22.4, 371/24, 25.1, 22.5, 22.6, 3; 395/183.06

(56) References Cited

U.S. PATENT DOCUMENTS

| | | | |
|---|---|---|---|
| 4,764,915 | * 8/1988 | Efron et al. | 369/58 |
| 5,027,353 | 6/1991 | Jarwala et al. | 371/27 |
| 5,029,166 | 7/1991 | Jarwala et al. | 371/22.1 |
| 5,130,988 | 7/1992 | Wilcox et al. | 371/22.3 |
| 5,166,937 | 11/1992 | Blecha, Jr. | 371/22.5 |
| 5,172,377 | 12/1992 | Robinson et al. | 371/22.3 |
| 5,175,494 | * 12/1992 | Yoshimori | 371/22.3 |
| 5,260,649 | 11/1993 | Parker et al. | 371/22.3 |
| 5,270,642 | * 12/1993 | Parker | 371/22.3 |

OTHER PUBLICATIONS

Jarwala et al., "A New Framework for Analyzing Test Generation and Diagnosis Algothrithms for Wiring Interconnects," 1989 Int'l Test Conf, 1989 IEEE, Paper 3.3, pp. 63–70.

de Jong, "Boundary Scan Test Used at Board Level–Moving Towards Reality," 1990 Int'l Test Conf, 1990 IEEE, Paper 9.2, pp. 235–242.

Hansen, "Testing Conventional Logic and Memory Clusters Using Boundary Scan Devices as Virtual ATE Channels," 1989 Int'l Test Conf, 1989 IEEE, Paper 7.1, pp. 166–173.

Kashiwabara et al., "Permutation Layout With Arbitrary Between–pins Capacities," 1990 IEEE, pp. 340–343.

McBean et al., "Bridging Fault Algorithms for a Boundary Scan Board," pp. 6/1–6/8.

Cheng et al., "Optimal Diagnostic Methods for Wiring Interconnects," 1992 IEEE Transactions on a Computer–Aided Design, vol. II, No. 9, Sep. 1992, pp. 1161–1166.

McBean et al., "Testing Interconnect: A Pin Adjacency Approach," 1993 IEEE, pp. 484–490.

Yau et al., "A Unified Theory for Designing Optimal Test Generation and Diagnosis Algorithms for Board Interconnects," 1989 Int'l Test Conf, 1989 IEEE, Paper 3.4, pp. 71–77.

Cheng et al., "Diagnosis for Wiring Interconnects," 1990 Int'l Test Conf., 1990 IEEE, Paper 27.2, pp. 565–571.

Hassan et al., "Testing and Diagnosis of Interconnects Using Boundary Scan Architecture," 1988 Int'l Test Conf, 1989 IEEE, Paper 7.1, pp. 126–137.

* cited by examiner

Primary Examiner—Christine T. Tu

(57) ABSTRACT

The invention is a method for assuring the integrity of a mission test. The method includes the steps of checking the integrity of the test after test execution but prior to test diagnosis. In particular, after the mission test has been executed, the integrity of the mission test is confirmed based on a comparison of the actual length of the scan path with an expected length of the scan path.

16 Claims, 8 Drawing Sheets

POST-MISSION TEST METHOD FOR CHECKING THE INTEGRITY OF A BOUNDARY SCAN TEST

BACKGROUND OF THE INVENTION

1. Field of the Invention

This invention relates to boundary scan testing. More particularly, this invention relates to a post-mission test method for assuring the integrity of the boundary scan test.

2. Background Art

Boundary scan is a testing standard formally known as IEEE/ANSI Standard 1149.1-1990. Boundary scan is applied principally at the Integrated Circuit (IC) level. Boundary scan ICs are designed with shift registers or cells place between each device pin and the internal logic of the IC. These cells allow an operator to control and observe what happens at each input and output pin. When these cells are connected together they form a data register chain, called the Boundary Register, defining a scan path. Additional registers within a boundary scan IC include and Instruction Register, which decodes instruction bits that allow the IC to perform various functions; a Bypass Register, which provides a one-bit scan path that minimizes the distance between the scan input and the scan output; an Identification Register, called the IDCODE Register, which identifies the device and manufacturer; and other designer-specified data registers, which typically perform internal test functions.

Boundary scan ICs are designed to be linked together into chains. A simple chain includes boundary scan ICs with common test clock terminals (TCK) and test mode select terminals (TMS); and with the scan paths of the ICs linked together by connecting a test data out (TDO) terminal of one IC to the test data in (TDI) terminal of the following IC.

For purposes of the following discussion, testing with boundary scan principles and techniques, and boundary scan IC chips and scan paths is referred to as boundary scan testing. A mission test includes a complete single test, such as an interconnect test, a connection test or an interaction test, as well, IC internal logic tests. A test frame refers to a portion of a mission test involving shifting in a test vector, writing the test vector to the test logic, which is part of the testing infrastructure, capturing a test result and shifting out the test results.

A more detailed discussion of boundary scan testing is provided in IEEE Standard 1149.1-1990, "IEEE Standard Test Access Port and Boundary Scan Architecture," IEEE Standards Board; "HP Boundary Scan Tutorial and BSDL Reference Guide," Hewlett-Packard Company, HP Part Number E1017-90001, 1990; and Kenneth P. Parker, *The Boundary-Scan Handbook*, (Kluwer Academic Publishers, 1992); each of which is incorporated herein by reference.

Prior to executing useful mission testing, an operator has to be able to depend upon the chain of register cells being in operational order. Therefore, the basic function of the chain needs to be assured before the results of the mission test can be relied upon. Testing the integrity of the chain prior to executing boundary scan testing is discussed in detail in *The Boundary-Scan Handbook* at pp. 114–117.

However, it has been identified by the inventors that it is possible that during execution of a mission test, an operational flaw in the scan path may occur, causing the integrity of the scan path to be compromised. For example, a test induced ground bounce or a timing condition may cause the integrity of the mission test to be compromised after the pre-mission test integrity test has been performed and, more particularly, during mission test execution.

If this occurs, the mission test results will be inaccurate. Diagnosing the inaccurate test results will result in invalid or erroneous diagnostic information. If this diagnostic information is relied upon, a significant amount of a technician's time may be wasted in attempting to repair faults that, in reality, do not exist. What it is needed is a method to detect when such an operational flaw occurs so that invalid test results can be discarded.

SUMMARY OF THE INVENTION

The invention is a method for performing and assuring the integrity of a mission test. The method includes the steps of checking the integrity of the mission test after mission test execution and prior to mission test diagnosis. In particular, after the mission test has been executed, the integrity of the mission test is confirmed based on a scan path bit length comparison.

The method in accordance with the invention comprises the steps of performing a mission test on a circuit, determining (after performance of the mission test) an actual bit length of a scan path through the circuit, comparing the actual bit length to an expected bit length and indicating the invalidity of the mission test if the actual bit length is not equal to the expected bit length.

The actual bit length of the scan path is determined at the end of mission test execution by shifting a signature pattern through the scan path. Specifically, the signature pattern shifted into the scan path is compared to the signature pattern shifted out. Based on this comparison, the actual bit length of the scan path can be determined.

Preferably, the signature pattern is shifted in concurrently with the shifting out of the last test result of the mission test. The length of the scan path can be determined based on the number of clock cycles required to shift the signature pattern through the scan path. This is most readily accomplished by shifting the scan path a number of clock cycles equal to twice the expected length of the scan path. If the signature pattern is equal in length to the scan path, then this will result in the test pattern traveling through the scan path with the last bit exiting the scan path on the last clock cycle. The last n bits out the scan path should then match the n bits of the signature pattern (for an n bit long scan chain). If the bits of the pattern out do not match the bits of the pattern in, then the actual length of the scan path does not match the expected length.

The method for testing a circuit board includes the steps of generating a group of mission test vectors, serially shifting each test vector into the scan path, writing each test vector to the test logic, capturing each response pattern, serially shifting each response pattern out of the scan path, shifting a signature pattern into the scan path, shifting the signature pattern out of the scan path, determining an actual bit length of the scan path, comparing the actual bit length with an expected bit length and indicating an invalid mission test if the actual bit length does not equal the expected bit length.

BRIEF DESCRIPTION OF THE FIGURES

Referring now to the drawings which form a part of this original disclosure.

DETAILED DESCRIPTION OF THE PREFERRED EMBODIMENTS

Figure 1:
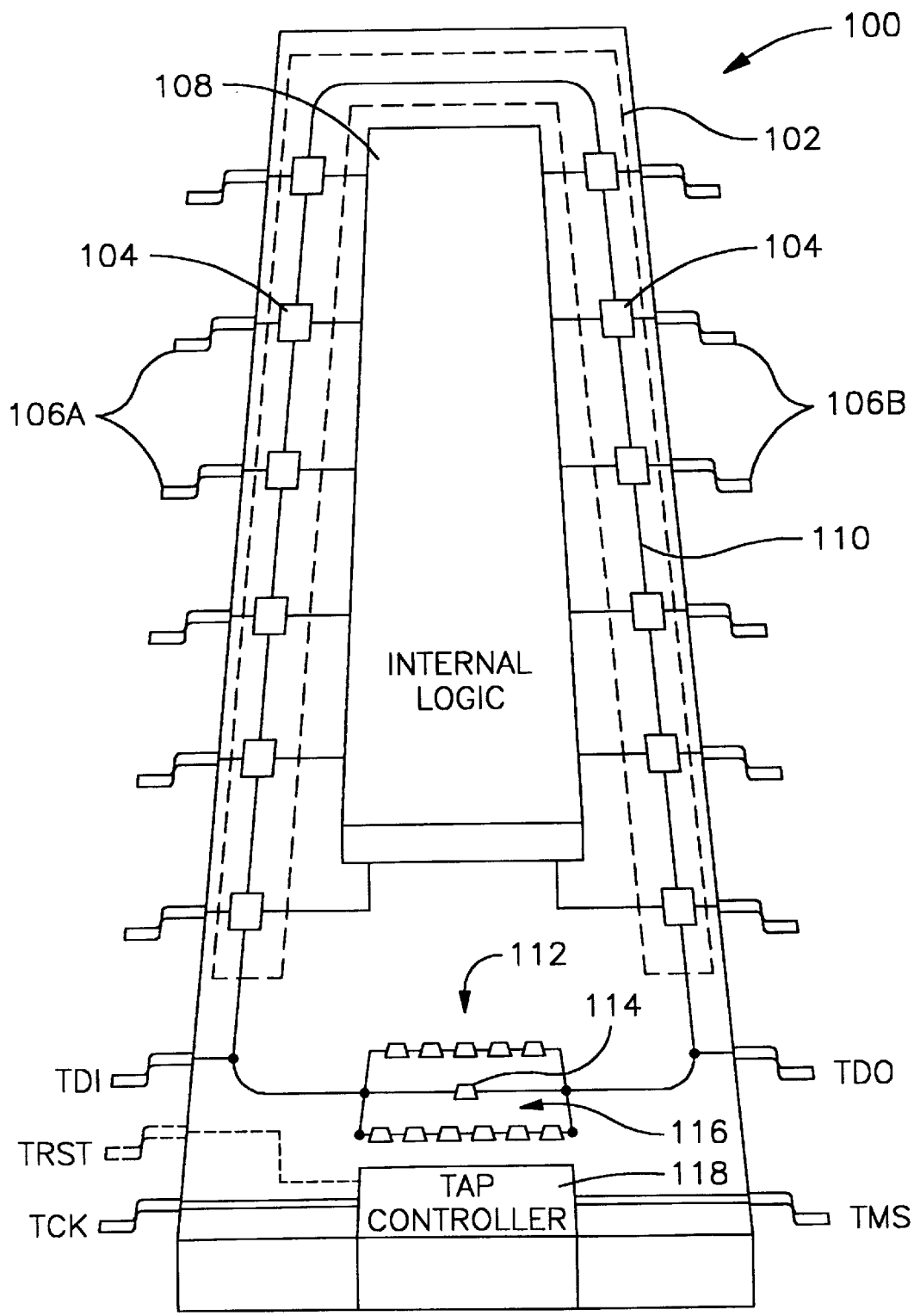
FIG. 1 is a diagram illustrating the structure of a typical boundary-scan device.

The preferred embodiments of the invention are discussed in detail below with reference to the figures where like reference numerals indicate like elements. Also in the figures, the left-most digits of each reference number corresponds to the figure in which the reference number is first used. Where specific part numbers and/or configurations are discussed, it should be understood that this is done for illustration purposes only. A person skilled in the relevant art will recognize that other components and configurations may be used without parting from the spirit and scope of the invention.

Boundary Scan

A boundary-scan IC chip 100 is shown in FIG. 1. A boundary register 102 is formed from a plurality of boundary register cells 104. Each register cell 104 is disposed between an I/O terminal 106(a)–(b) and the internal logic 108 of chip 100. As a matter of convention, input terminals 106(a) are shown on the left-hand side of chip 100, and output terminals 106(b) are shown on the right-hand side of chip 100. Some of the I/O terminals may be bi-directional.

A scan path or scan chain 110 is formed through boundary register 102. An IDCODE (i.e., identification) register 112, a bypass register 114, and an instruction register 116 are also included in chip 100. IDCODE register 112 provides identification data for chip 100. Bypass register 114 is a one-bit register which allows boundary register 102 to be bypassed. Instruction register 116 decodes instruction bits which are used to select test mode and also to control the operational mode of the chip during the test.

A test access port (TAP) controller 118 is a state machine which controls boundary register 102. Five I/O terminals have been added to chip 100 to accommodate boundary-scan. These five terminals constitute the test access port (TAP). A TDI (test data in) terminal provides serial test data and instruction bits to scan path 110. A TDO (test data out) terminal provides serial output for scan path 110. A TCK (test clock) terminal provides an independent test clock to chip 100. A TMS (test mode select) terminal provides the logic levels needed to change the state of TAP controller 118. A TRST (test rest) terminal is used to reset chip 100. The TRST terminal, shown in phantom, is optional.

The Boundary-Scan Standard (IEEE 1149.1-1990) allows for ICs to be linked into chains by linking the TDO pin of one IC with the TDI pin of the next IC. This is illustrated by a sample circuit 200 shown in FIG. 2. Circuit 200 includes six interconnected IC's U1–U6. Boundary register cells 104 are shown in each IC. Following convention, input cells are shown on the left-hand side of each IC, and output cells are shown on the right-hand side of each IC. Each pin of each IC is numbered consecutively from the lower left-hand corner and is referenced by that number along with the IC reference number. For example, U1–3 refers to pin 3 of U1.

A scan path 110 is shown connecting register cells 104 of IC's U1–U6. Register cells 104 in scan path 110 form the boundary register (102 in FIG. 1).

TAP Controller

Figure 3:
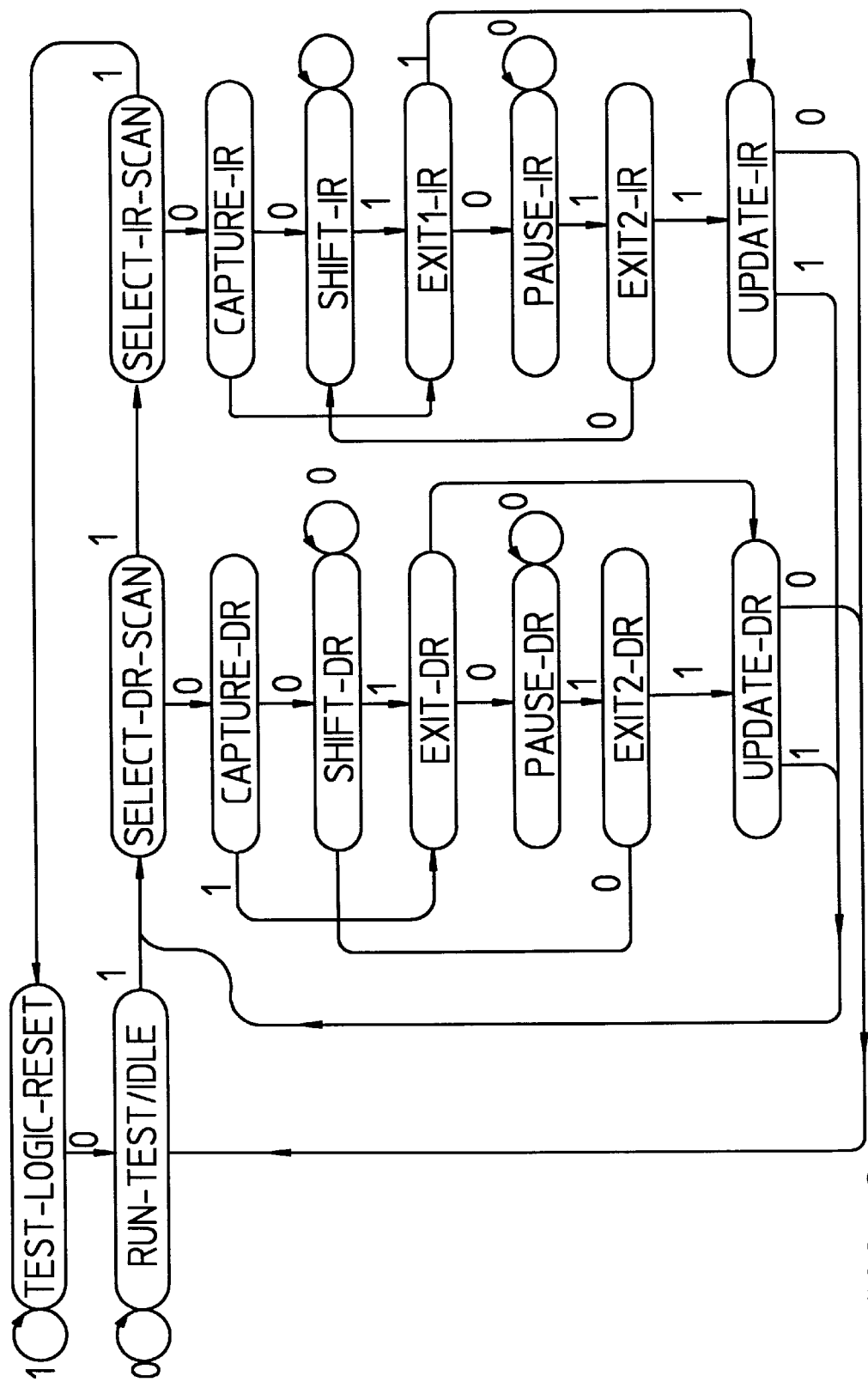
FIG. 3 is a diagram illustrating the TAP controller state diagram.

Referring now to FIG. 3, a TAP Controller state diagram for TAP Controller 118 is shown. The TAP Controller is a sixteen-state state machine that controls each boundary scan IC chip 100. For example, the TAP Controller controls the shifting of test instructions and data bits into and out of chip 100 (FIG. 1). The TAP Controller state diagram illustrates general operation of boundary scan test circuitry. Each of the ICs connected in, for example, scan path 110 follow the same path through the TAP Controller state diagram. In other words, all the chips U1–U6 are in the same TAP state at any given time.

Briefly, the TAP Controller state diagram includes two columns with nearly identical labels for each position within the columns. Each position represents a state of the TAP Controller. The sixteen states vary only by the suffixes appended to the end of each state. The suffixes identify the column and register operation that they affect. DR is the data registers column. The states of the data registers are controlled by the states shown in this column. The data registers can be the Boundary Register, the Bypass Register, or the ID Register.

IR is the instruction register column. The states of the instruction registers are controlled by the states in this column. The instruction register is a mandatory component of every boundary-scan device. Along the data flow lines connecting each TAP state, a zero or a one is shown. These numbers indicate the bit state of the TMS input signal required to move from one state to the next. Thus, the TMS input signal controls the changing of states. The TAP Controller state diagram changes to the state indicated by the TMS value only during a rising edge of the test clock (TCK). The TEST-LOGIC-RESET is the normal starting state of the device.

Initial Integrity Test

Generally, prior to executing a mission test, the integrity of scan path 110 is tested. This ensures that scan path 110 is in operational order and is not damaged. Scan path 110 may be damaged if, for example, a component in scan path 110 is dead or missing, a component in scan path 110 has a broken connection for one of its TAP pins, or a TDO to TDI connection between components is shorted to another node. To implement this initial integrity test for scan path 110 (see FIG. 2), the Instruction Registers of each IC chip U1–U6 must be programmed prior to performing the initial integrity test. Then, each IC chip U1–U6 in scan path 110 sets up a deterministic data pattern in its Instruction Register at CAPTURE-IR. Then, all the concatenated data is shifted out of the last IC chip U4. Based on the Boundary Scan Description Language (BSDL) for each chip U1–U6, it is known what this output data will be. For information about BSDL, see, generally, chapter two of *The Boundary Scan Handbook*. Accordingly, by comparison, it can be determined whether the integrity of scan path 110 is intact. A detailed discussion of this initial integrity testing of scan path 110 is provided in *The Boundary-Scan Handbook* at pp. 114–117.

Figure 4:
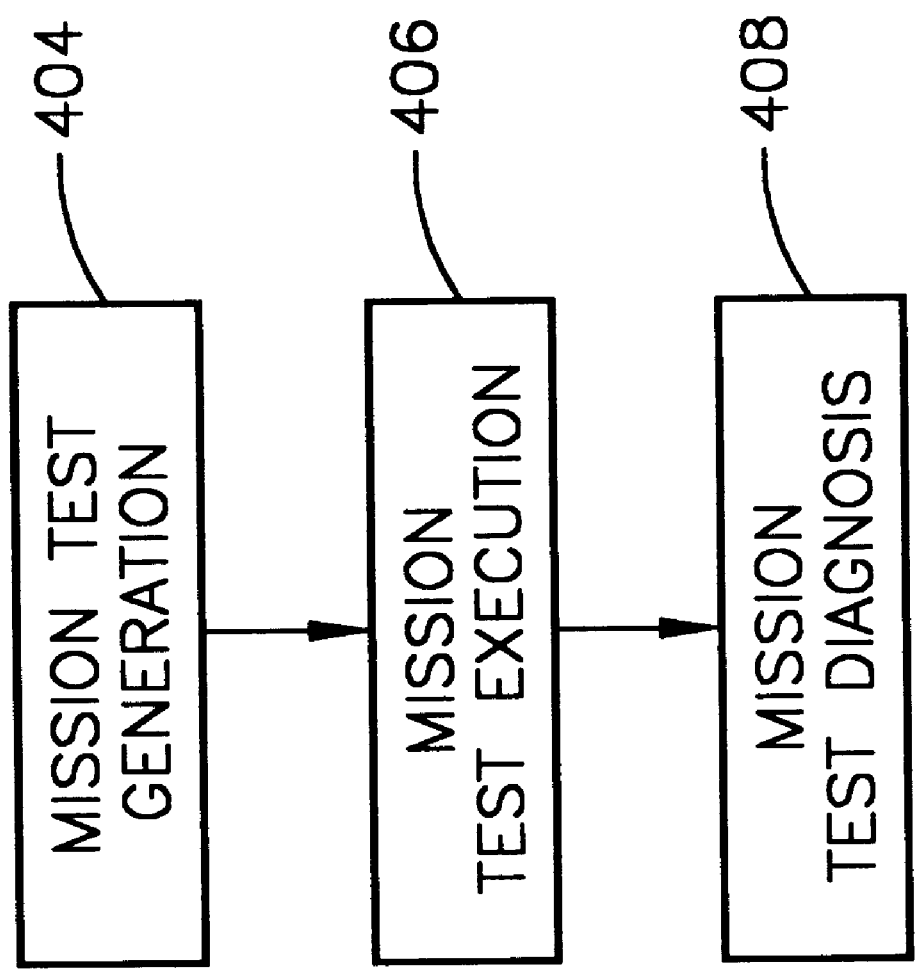
FIG. 4 is a flow chart providing an overview of a mission test method.

As shown in FIG. 4, conventionally, a mission test is generated at step 404, executed at step 406 and, thereafter, the results of the mission test are diagnosed at step 408. To assure that the results of the test will be reliable, generally, the integrity test described above is performed on scan path 110 prior to mission test execution. This initial integrity test is run prior to execution of a mission and, generally, is only run once prior to plural mission tests. Thereafter, the integrity of scan path 110, generally, is considered to be assured based on the initial integrity test. Accordingly, the test results of the mission test are considered to be reliable without further assurances and are summarily diagnosed at step 408 to obtain, ostensibly, reliable test diagnosis.

Figure 5:
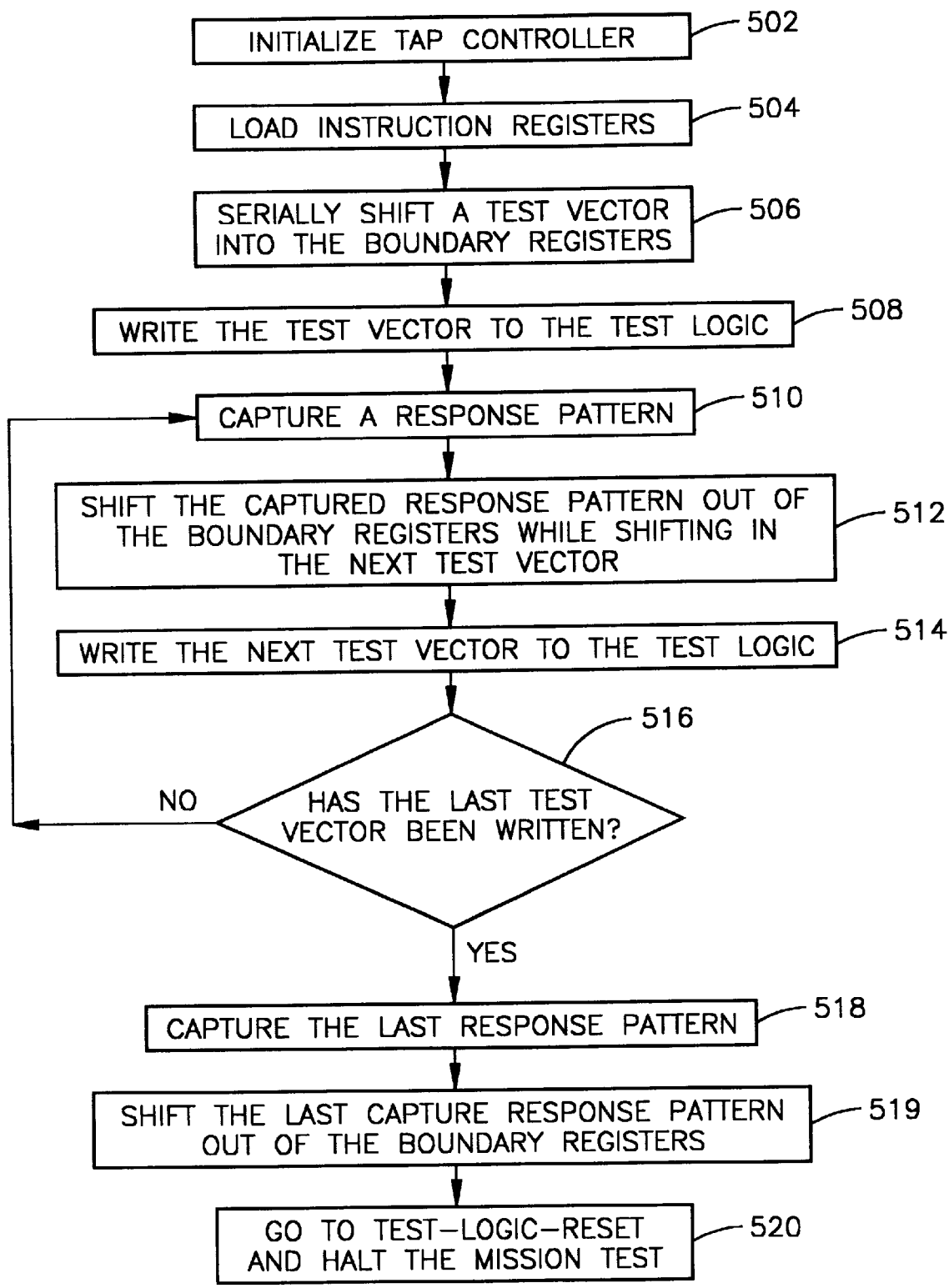
FIG. 5 is a flow chart detailing the steps of the mission test execution step shown in FIG. 4.

FIG. 5 details the steps of the mission test execution step 406 shown in FIG. 4. For purposes of this discussion, the basic test process of mission testing is discussed. First, at step 502, the TAP Controller is initialized to TEST-LOGIC-RESET. (See FIG. 3 for the diagram of the TAP Controller.) At step 504, the Instruction Registers are loaded such that the boundary register is put between TDI and TDO for each IC. At step 506, a test vector is serially shifted into the boundary register. Then, at step 508, the test vector is written to the test logic. At step 510, a response pattern is captured (read) into the shift portion of the Boundary Registers. At step 512, the captured response pattern is shifted out of the Boundary Registers while the next test vector is being shifted into the Boundary Registers. At step 514, the next test vector is written to the test logic. If, at decision step 516, the last test vector has been written to the test logic, then the last response pattern is captured at step 518 and written to the test logic at step 519. If the last test vector has not been written to the test logic, then a response pattern is captured at step 510. Finally, at step 520, after all the response patterns have been captured, the mission test is stopped and returned to TEST-LOGIC-RESET, at step 520. A more detailed discussion of the basic mission test execution steps is found in *The Boundary-Scan Handbook* at pp. 103–105.

Although an initial integrity test is performed prior to mission test execution step 406, the inventors recognize that it is possible that after the initial integrity test and/or during mission test execution, an operational flaw may occur in the IC chip 100 circuitry and cause the mission test to behave incorrectly. For example, a mission test induced ground bounce may cause the injection of extra pulses on the TCK line which will cause an advance in TAP Controller 118 to an unexpected state. Accordingly, one or more of the ICs on the board may be at a different state than the other ICs. A timing condition (e.g., a critical race) in the TAP Controller may also cause improper state sequencing. These types of anomalous conditions can easily destroy the integrity of the mission test, causing mission test diagnosis routines to produce misleading or useless reports or, no reports at all.

Consider the ground bounce problem. It is highly likely that ground bounce will occur (if at all) at a particular state transition in the TAP state diagram (FIG. 3), for example, from state UPDATE-DR (or UPDATE-IR) to state SELECT-DR-SCAN. This is because this transition (on the falling edge of TCK) may cause a large number of digital drivers to change state simultaneously. The changing of these drivers can cause rapid fluctuations in current demand on the board or within the IC chips themselves. This changing current, in conjunction with the inherent inductances in the power distribution paths, may cause an impression of voltage spikes on localized ground points that can cause a complementary impression of a voltage signal on an edge-sensitive device such as the clock TCK.

When making the transition to SELECT-DR-SCAN, the TMS line (which "steers" the transitions) is set to 1. If an extra TCK clock pulse occurs due to ground bounce, the result is to end up one state farther in the diagram, at state SELECT-IR-SCAN. The subsequent testing that wants to proceed one to CAPTURE-DR, etc, instead proceeds to CAPTURE-IR, etc. This has the effect of reprogramming the instruction register 116 of the effected IC chip 100 with random test data, which destroys the mission test setup. The net effect of this is that several IC chips 100 may "fall out" of their programmed test modes into some other instruction state. This may cause some other register (e.g., the instruction register 116 or the bypass register 114) to be substituted between TDI and TDO rather than the desired boundary register 102. Furthermore, it is likely that this other register will have a different length than boundary register 102, so that subsequent shifting operations will now be out of synchronization. For a more detailed discussion of ground bounce see *The boundary Scan Handbook* at pp. 167–169.

Figure 2:
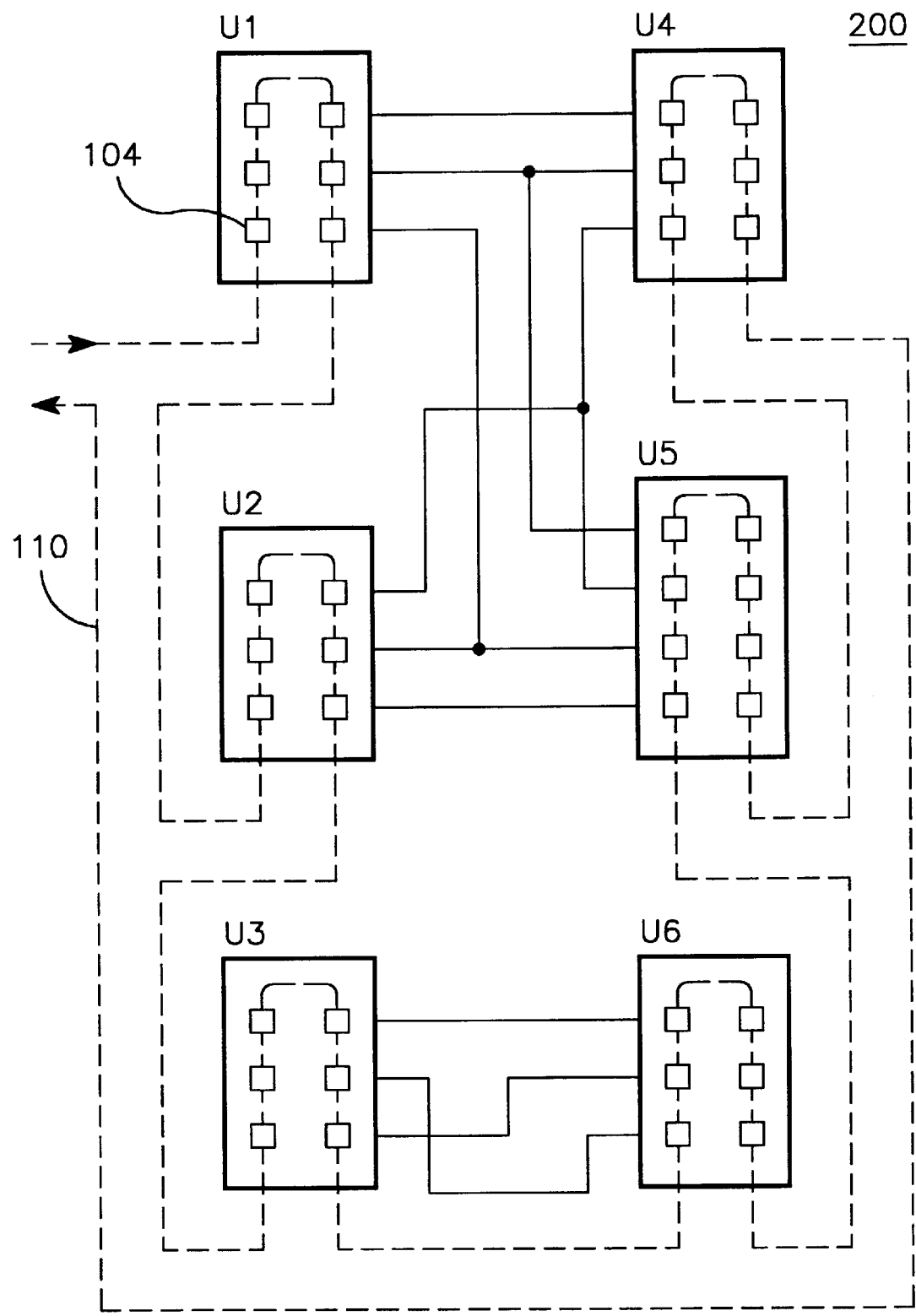
FIG. 2 is a schematic diagram of a sample circuit used to illustrate boundary-scan testing.

Similarly, as discussed above, a timing condition, such as critical race may also cause the integrity of scan path 110 to be compromised during mission test execution. In such case, for example, the actual register in scan path 110 is different from the expected register in scan path 110. Therefore, the actual bit length of scan path 110 will be different from the expected bit length. To illustrate this point, FIG. 2 is referred to. In particular, FIG. 2 shows a scan path 110 passing through the boundary register cells 104 of IC chips U1–U6. Accordingly, this scan path includes thirty-eight cells 104 representing thirty-eight bits. Thus, when a mission test is executed, the user relies on the configuration of scan path 110 remaining the same. Accordingly, since scan path 110 is thirty-eight bits long, the operator will serially shift the thirty-eight bit long test vector into the boundary register cells 104 expecting a thirty-eight bit response pattern to be shifted out. Accordingly, the operator, relying on the configuration of scan path 110, simply identifies the next thirty-eight bits that are shifted out of scan path 110 to be the thirty-eight bit response pattern. However, if, for example, during mission test execution, IC chip U5 has been reconfigured such that scan path 110 passes through the one-bit Bypass Register rather than the eight boundary register cells, the response pattern will only be thirty-one bits long. Nonetheless, the operator, relying on the assumption that the configuration of scan path 110 is the same, simply takes the next thirty-eight bits shifted out of scan path 110 as the response pattern. In actuality, the response pattern is only thirty-one bits. Obviously, the thirty-eight bit response pattern is incorrect. Nonetheless, mission test diagnosis is performed on this inaccurate response pattern.

Since the response pattern of the mission test is incorrect, misleading or useless diagnostics will result. For example, the diagnostics may indicate that certain pins are open or shorted. However, in actuality one of the ICs 100 on the circuit board may have become reconfigured. Based on this inaccurate data or mission test result, an operator may be led to believe that something is seriously wrong with the circuit board. Accordingly, a low-skilled technician may be given a repair ticket to repair the board. However, the technician will be wasting time looking for problems which may not actually exist.

The inventors have discovered that such problems can be avoided by checking the integrity of scan path 110 prior to mission test diagnosis. If the integrity of scan path 110 is found to have been compromised after the mission test is executed and prior to test diagnosis, then it is likely that something fairly sophisticated is wrong with the board. Thus, before mission test diagnosis is begun, the board can be sent to an engineering station for an engineer to determine why the integrity of scan path 110 has been compromised during test execution.

Post-Mission Test Integrity Check

Figure 6:
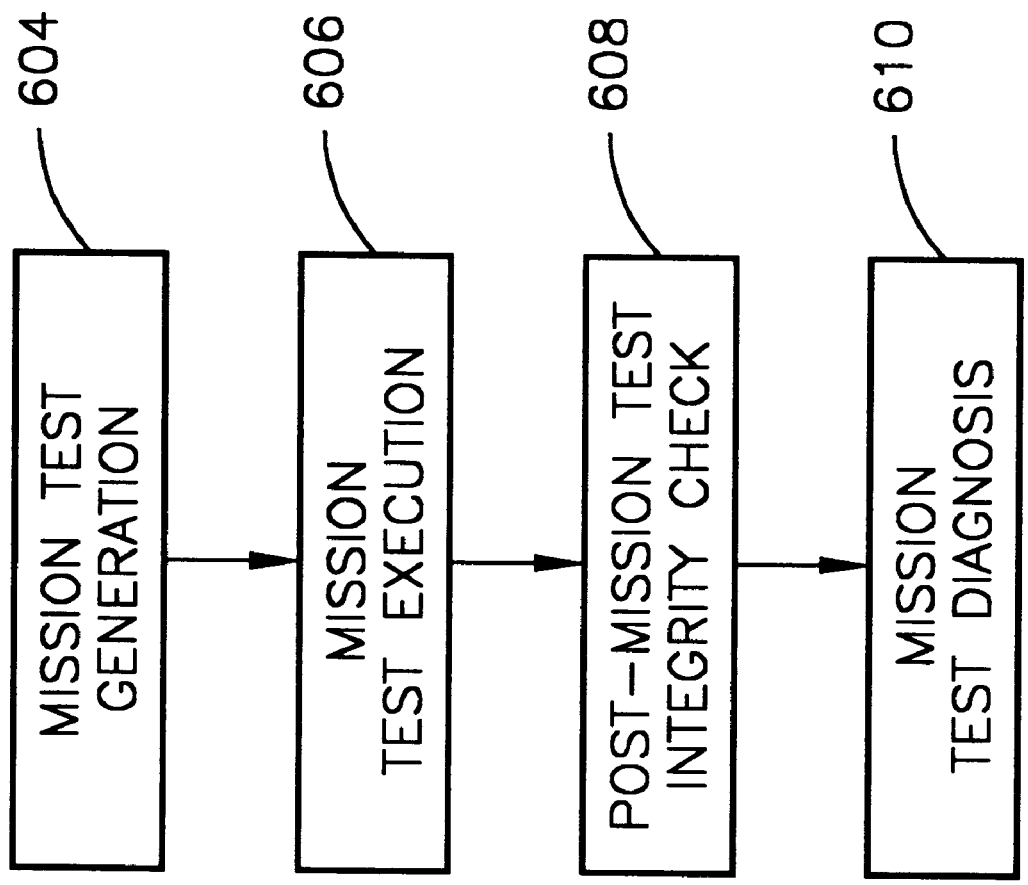
FIG. 6 is a flow chart providing an overview of the mission test method in accordance with the invention.
Figure 8:
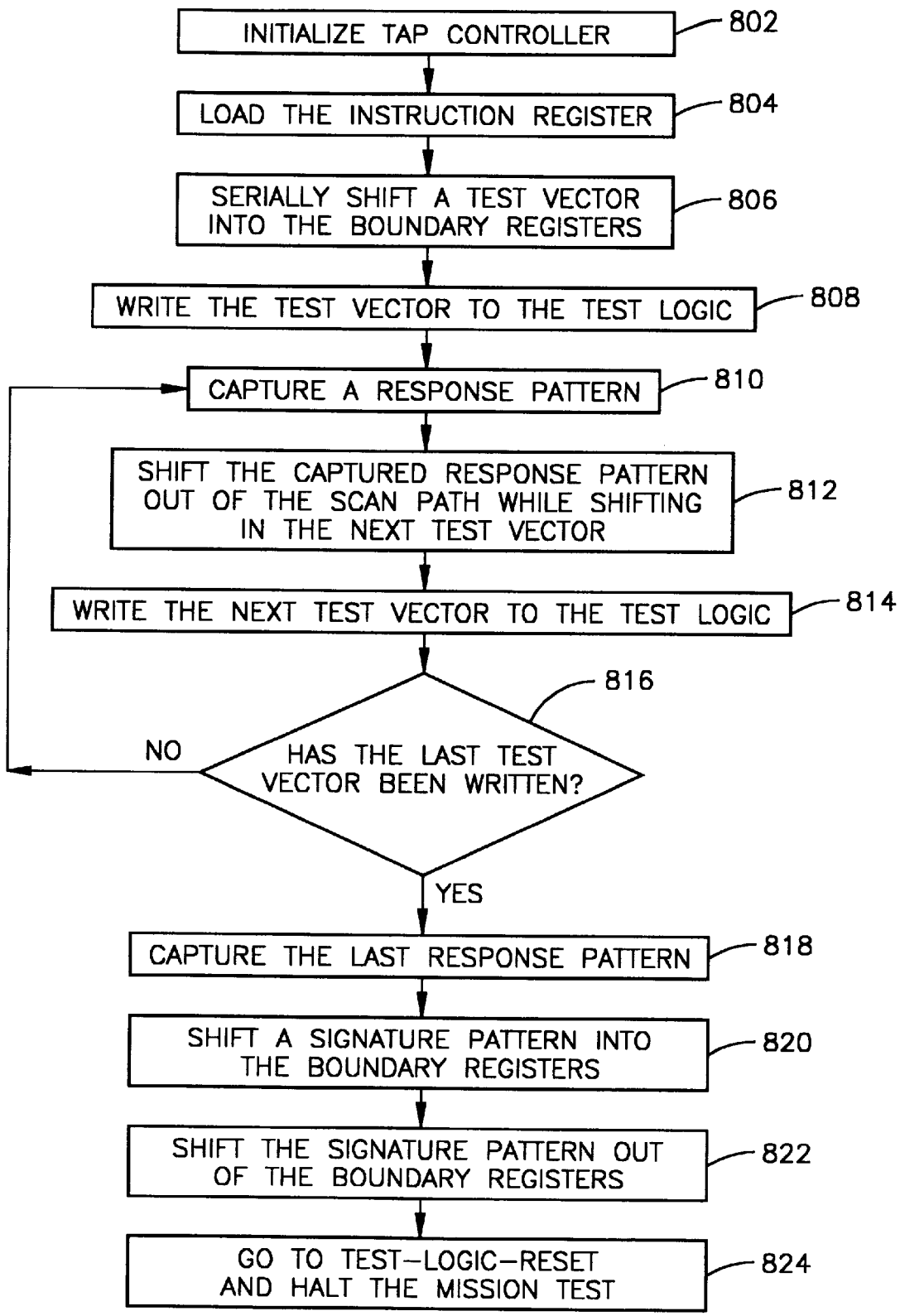
FIG. 8 is a flow chart detailing the steps of the mission test execution step of the present invention shown in FIG. 6.

FIG. 6 shows the steps in accordance with the invention for performing a mission test. In accordance with the invention, a mission test is generated, at step 604, by generating a plurality of mission test vectors. Then the mission test of the present invention is executed at step 606, as discussed in the following and as shown in FIG. 8. Preferably, an initial integrity test, as discussed above, is performed prior to test execution step 606. In addition, as will be illustrated in the following discussion, although steps 606 and 608 are depicted and discussed as separate steps, it is understood that parts of step 606 may overlap with parts of step 608 and vice versa.

In accordance with the invention, after the mission test has been executed at step 606 and prior to mission test diagnosis at step 610, a post-mission test integrity check is performed at step 608 to assure the integrity of the executed mission test. This post-mission test integrity check of step 608 identifies whether scan path 110 has been reconfigured at some point after the initial integrity test or during mission test execution step 606.

Figure 7:
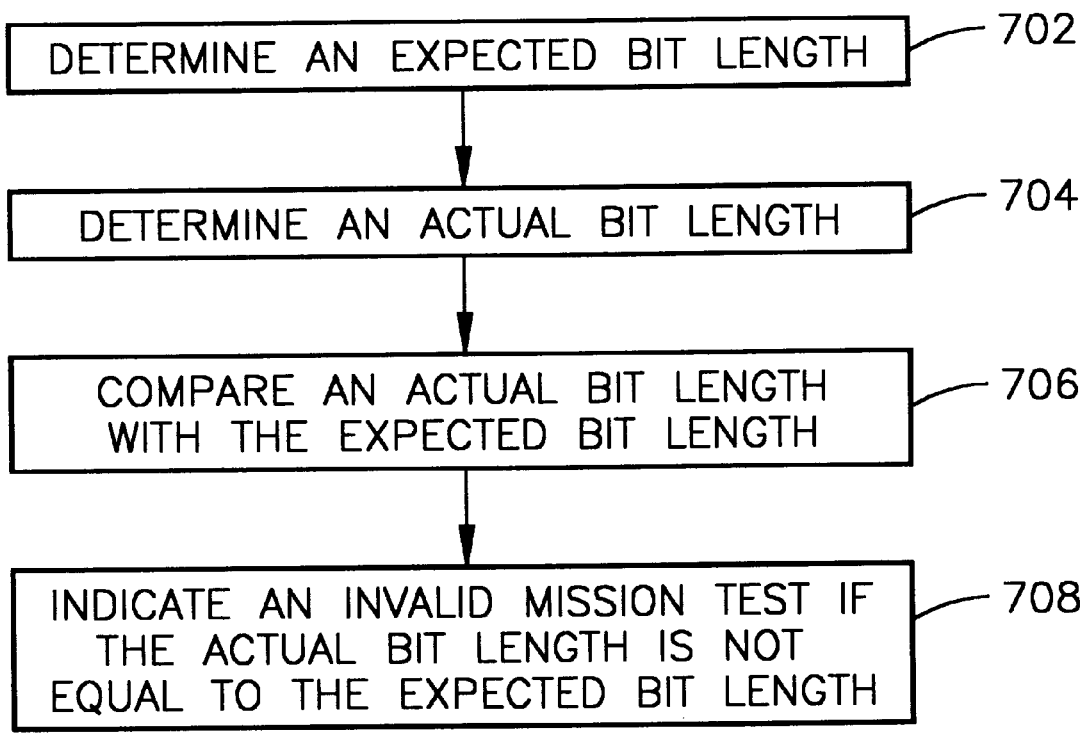
FIG. 7 is a flow chart detailing the steps of the post-mission test integrity check step of the present invention shown in FIG. 6.

Referring now to FIG. 7, the steps for performing the post-mission test integrity check of step 608 are shown. In particular, the inventors recognized that if scan path 110 has been reconfigured during testing, the bit length of scan path 110 will likely have changed from the expected bit length. Accordingly, an expected bit length is determined at step 702. The expected bit length represents the quantity of bits in scan path 110. This quantity is generally known or can be calculated. In particular, the expected bit length may be calculated by adding the bits in scan path 110.

An actual bit length of scan path 110 is determined at step 704. How the actual bit length is determined is discussed in greater detail in the following discussion. The actual bit length represents the actual configuration of scan path 110 after the mission test has been executed. At step 706, the actual bit length is compared with the expected bit length. An invalid mission test is indicated at step 708 if the actual bit length is not equal to the expected bit length. Although step 702 is shown to be performed prior to step 704, step 702 may be performed at any point prior to the step 706, which is when the expected bit length must be known so that the comparison between the expected bit length and the actual bit length can be made.

As shown in FIG. 8, the details of mission test execution step 606 are shown. Steps 802, 804, 806, 808, 810, 812, 814, 816, 822 and 824 are the same steps shown in FIG. 5 and discussed above. Accordingly, no further discussion is provided. In accordance with the invention, after the last response pattern has been captured at step 818, the last captured response pattern is shifted out while a signature pattern is shifted into scan path 110 at step 820. The signature pattern is shifted out of the scan path at step 822. Thereafter, the circuit can proceed to TEST-LOGIC-RESET and halt the mission test at step 824.

It is important that the signature pattern be shifted through scan path 110 before the Instruction Register is reprogrammed such that scan path 110 remains in the same configuration as when the mission test produced the response pattern. In the present invention, the signature pattern may be shifted into the scan path 110 while shifting the last response pattern out. Then, the signature pattern is shifted out by shifting "don't care" or random bits into scan path 110. However, it is within the scope of the invention to have the signature pattern shifted into scan path 110 independent of the last response pattern. Moreover, FIG. 8 shows steps 820 and 822 at the end of the executed mission test, that is, after the last response pattern has been capture among a series of test vectors. However, it is within the scope of the invention to perform steps 820 and 822 after step 810 or 812. Accordingly, steps 820 and 822 may be performed after every frame in the mission test or at the end of the entire mission test.

Preferably, the signature pattern is shifted in concurrently with the shifting out of the last test result of the mission test. The length of the scan path can be determined based on the number of clock cycles required to shift the signature pattern through the scan path. This is most readily accomplished by shifting the scan path a number of clock cycles equal to twice the expected length of the scan path. If the signature pattern is equal in length to the scan path, then this will result in the test pattern traveling through the scan path with the last bit exiting the scan path on the last clock cycle. The last n bits out the scan path should then match the n bits of the signature pattern (for an n bit long scan chain). If the bits of the pattern out do not match the bits of the pattern in, then the actual length of the scan path does not match the expected length. For convenience, preferably, the signature pattern has a bit length equal to the expected bit length. If the actual bit length of scan path 110 is equal to the expected length of scan path 110, then when the signature pattern is shifted into the boundary register cells 104 of scan path 110, all the bits should be disposed in each of the boundary register cells 104 of scan path 110. That is, none of the signature pattern bits should have been outputted. The signature pattern is shifted out by shifting a quantity of "don't care" bits (equal to the expected bit length or signature pattern bit length) into scan path 110. If the signature pattern shifted out is not identical to the signature pattern shifted in, then scan path 110 has been reconfigured during mission test execution step 606. If the signature pattern shifted out is identical to the signature pattern shifted in, then the configuration of scan path 110 has remained unchanged.

For purposes of illustration, FIG. 2 is referred to. For example, "01001100011100001111000001111100001111" may be set up as the thirty-eight bit signature pattern (which is equal to the expected bit length of scan path 110). This signature pattern may then be shifted into the thirty-eight bit scan path 110 shown in FIG. 2. When the entire signature pattern is shifted into the boundary register cells 104 of scan path 110, each bit will occupy one of the boundary register cells 104. The thirty-eight bit signature pattern is shifted out of scan path 110 as discussed above. If the configuration of scan path 100 has not been changed during mission test execution step 606, then the output signature pattern will be identical to the input signature pattern. If however, the configuration of scan path 110 has been compromised during mission test execution, the compromised output signature pattern will not be identical to the input signature pattern. For example, as discussed above, if during mission test execution step 606 one of the IC chips, such as U5 (FIG. 2) shifts over from the eight bit boundary register (as shown) to the one bit instruction register (not shown) then the bit length of scan path 110 has been reconfigured to a thirty-one bit length rather than the expected thirty-eight bit length. Accordingly, the output signature pattern will be compromised and will not be identical to the input signature pattern. Specifically, the compromised output signature pattern will be "XXXXXXX0100110001110000111100000111110", where "X" is used merely as a means of representing the "don't care" bits.

In addition, the signature pattern may be shifted in and out of scan path 110 as discussed above. In this embodiment, the output of scan path 110 may be monitored for the presence of the signature bit pattern. Then, the response pattern of the mission test can be identified and distinguished from the signature bit pattern (on one end of the response pattern) and from the known bits (on the other end of the response pattern). Once the response pattern of the mission test is identified, then the bit length of the response pattern is counted to obtain the actual bit length of the scan path 110.

Furthermore, the signature pattern is shifted through scan path 110 independent of the response pattern and after test execution step 606. In accordance with this embodiment, the operator identifies "when" the bit pattern begins to shift out of scan path 110 to determine the actual bit length of scan path 110 after test execution. For example, a number of clock cycles TCK required to shift the bit pattern through scan path 110 is counted and compared.

In accordance with the invention, if the actual bit length is not equal to the expected bit length at step 614, then the configuration of scan path 110 has been compromised during test execution step 608 and an invalid test is indicated. Accordingly, a test operator will know that the scan path 110 has been reconfigured after test execution step 608 and will not proceed with test diagnosis until the integrity of scan path 110 is fixed and assured.

By identifying that the integrity of scan path 110 has been compromised after test execution step 608 and prior to test diagnosis, the possibility of performing a test diagnosis on worthless and misleading test results will be avoided. Moreover, an operator may more efficiently effect repair of the circuitry knowing that the integrity of the boundary scan circuitry was compromised during test execution.

While the invention has been particularly shown and described with reference to the preferred embodiments thereof, it will understood by those skilled in the art that various changes in form and details may be made therein without departing from the spirit and scope of the invention.

What is claimed is:

1. A boundary scan testing method for performing a mission test on a circuit under test formed by a plurality of interconnected integrated circuit (IC) chips, each chip having internal logic and a boundary scan circuit, wherein the plurality of boundary scan circuits are interconnected to form a scan path, and confirming the integrity of the mission test after the mission test has been performed, comprising the steps of:

executing the mission test on the circuit under test, wherein the scan path has a pre-test configuration;

determining, after performance of the mission test, a post-test configuration of the scan path;

comparing said pre-test configuration with said post-test configuration; and confirming the integrity of the mission test if said pre-test configuration is the same as said post-test configuration.

2. The method according to claim 1, wherein said step of determining said post-test configuration comprises determining an actual bit length of the scan path in said post-test configuration;

said step of comparing comprises comparing said actual bit length to an expected bit length of the scan path in said pre-test configuration; and said step of confirming the integrity of the mission test comprises confirming that said actual bit length is equal to said expected bit length.

3. The method according to claim 2, wherein said step of determining said actual bit length of the scan path in said post-test configuration comprises the step of:

shifting a signature pattern through the circuit.

4. The method according to claim 1, wherein said step of executing the mission test comprises the steps of:

shifting a test vector into the scan path in said pre-test configuration;

writing said test vector to the circuit under test;

capturing into the scan path a response pattern of said test vector; and shifting said response pattern out of the scan path in said post-test configuration.

5. The method according to claim 1, wherein the mission test includes more than one test vector and said step of executing the mission test comprises, for each test vector, the steps of:

shifting the test vector into the scan path in said pre-test configuration;

writing said test vector to the circuit under test;

capturing into the scan path a response pattern of said test vector; and shifting said response pattern out of the scan path in said post-test configuration.

6. A method for testing a circuit under test formed by a plurality of interconnected integrated circuit (IC) chips, each chip having internal logic and a boundary scan circuit, wherein the plurality of boundary scan circuits are interconnected to form a scan path, the method comprising the steps of:

serially shifting a mission test vector into the scan path in a pre-test configuration;

writing said test vector to the circuit under test;

capturing into the scan path a response pattern;

serially shifting said response pattern out of the scan path, wherein the scan path has a post-test configuration after the preceding steps have been performed; and shifting a signature pattern through the scan path in said post-test configuration to determine an actual bit length of the scan path in said post-test configuration.

7. The method according to claim 6, further comprising the steps of:

comparing said actual bit length of the scan path in said post-test configuration with an expected bit length of the scan path in said pre-test configuration; and indicating an invalid mission test if said actual bit length does not equal said expected bit length.

8. The method according to claim 6, wherein said step of shifting a signature pattern through the scan path comprises completely shifting the signature pattern through the scan path in the post-test configuration to determine the actual bit length of the scan path in the post-test configuration.

9. The method according to claim 6, wherein said step of shifting a signature pattern through the scan path comprises partially shifting the signature pattern through the scan path in the post-test configuration prior to determining the actual bit length of the scan path in the post-test configuration.

10. The method according to claim 6, further comprising the step of:

repeating, for a plurality of missions test vectors, said steps of serially shifting said mission test vector into the scan path, writing said test vector to the circuit under test, capturing a response pattern and serially shifting said response pattern out of the scan path, prior to said step of shifting said signature pattern through the scan path.

11. A method for testing a circuit under test formed by a plurality of interconnected integrated circuit (IC) chips, each chip having internal logic and a boundary scan circuit, wherein the plurality of boundary scan circuits are interconnected to form a scan path, the method comprising the steps of:

executing a mission test to test interconnects in the scan path on the circuit board;

checking an integrity of the scan path after execution of the mission test to confirm that the mission test is valid; and diagnosing a result of the mission test only when the checking step confirms that the mission test is valid.

12. The method according to claim 11, wherein the step of checking the integrity of the scan path after execution of the mission test comprises:

determining an actual bit length of the scan path after the mission test has been executed;

comparing said actual bit length to an expected bit length; and indicating an invalid mission test if said actual bit length is not equal to said expected bit length.

13. The method according to claim 11, wherein said step of checking comprises the step of:

shifting a signature pattern through the scan path in a post-test configuration to determine an actual bit length of the scan path in said post-test configuration.

14. The method according to claim 13, wherein said step of shifting comprises completely shifting the signature pattern through the scan path in the post-test configuration prior to determining the actual bit length of the scan path in the post-test configuration.

15. The method according to claim 13, wherein said step of shifting comprises partially shifting the signature pattern through the scan path in the post-test configuration prior to determining the actual bit length of the scan path in the post-test configuration.

16. The method according to claim 11, wherein the mission test includes more than one test vector and said step of executing said mission test comprises, for each of said plurality of vectors, the steps of:

shifting a test vector into the scan path;

writing the test vector to the circuit under test;

capturing a response pattern; and shifting the response pattern out of the scan path.

* * * * *